United States Patent
Kasargod et al.

(10) Patent No.: US 7,961,888 B2
(45) Date of Patent: Jun. 14, 2011

(54) METHOD AND SYSTEM FOR ENHANCING BASS EFFECT IN AUDIO SIGNALS

(75) Inventors: Sudhir K. Kasargod, Singapore (SG); Sapna George, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 1579 days.

(21) Appl. No.: 11/280,952

(22) Filed: Nov. 16, 2005

(65) Prior Publication Data
US 2006/0147046 A1 Jul. 6, 2006

(30) Foreign Application Priority Data
Dec. 31, 2004 (SG) ................................. 200407881-2

(51) Int. Cl.
*H04R 5/00* (2006.01)
*H03G 5/00* (2006.01)
*H04B 1/00* (2006.01)

(52) U.S. Cl. .................. 381/1; 381/98; 381/99; 381/17; 381/18; 381/19; 381/119

(58) Field of Classification Search ............... 381/98, 381/1, 17–19, 119, 99
See application file for complete search history.

(56) References Cited

U.S. PATENT DOCUMENTS

| | | | |
|---|---|---|---|
| 4,698,842 A | 10/1987 | Mackie et al. | |
| 5,930,373 A | 7/1999 | Shashoua et al. | |
| 6,134,330 A * | 10/2000 | De Poortere et al. | 381/61 |
| 6,285,767 B1 * | 9/2001 | Klayman | 381/17 |

OTHER PUBLICATIONS

Woon, et a., "Virtual Bass for Home entertainment Multimedia PC, Game Station and Portable Audio Systems," IEEE Transactions on Consumer Electronics, vol. 47, No. 4, Nov. 2001.

* cited by examiner

*Primary Examiner* — Devona E Faulk
(74) *Attorney, Agent, or Firm* — Lisa K. Jorgenson; Andre M. Szuwalski

(57) ABSTRACT

The quality of music output from audio systems is improved by simulating the effect of low frequency signals in the human ear. This thus allows listeners to perceive the lower frequency signals, even though the speakers may be incapable of providing such low frequency outputs. A method is provided for processing enhancing bass effect in audio signals. The method also results in the bass enhancement being computationally less intensive. The bass effect enhancement techniques are based on the response of sine and cosine transfer functions and on the directional independence of low frequency components. The human ear is unable to resolve directions from low frequency components. The bass effect enhancement technique alternatively is based on response of an exponential transfer function.

42 Claims, 6 Drawing Sheets

METHOD AND SYSTEM FOR ENHANCING BASS EFFECT IN AUDIO SIGNALS

PRIORITY CLAIM

The present application claims priority from Singapore Patent Application No. 200407881-2 filed Dec. 31, 2004, the disclosure of which is hereby incorporated by reference.

FIELD OF THE INVENTION

The present invention relates to a method and system for enhancing bass effect in audio signals. In particular, this invention relates to a method and system for enhancing bass effect of audio signals using low complexity non-linear saturating functions.

BACKGROUND OF THE INVENTION

There have been many methods proposed for enhancing perception of bass content of audio signals. These methods vary from enhancing a certain band of frequencies to using amplitude modulation. Almost all of these methods are based on either temporal theory or place theory of pitch perception.

One method of bass enhancement generates consecutive harmonics for low frequency content of audio signals. Harmonic signals generated are modified according to a psychoacoustic model and are output to the speakers. In this method, loudness modeling of the ear is used for adjusting amplitudes of the harmonics to match amplitude of the low frequency signal.

Another method of bass enhancement generates only even harmonics of the lower frequencies and a band of frequencies just above this bass frequency is enhanced to give a better bass effect.

Yet another, is based on the amplitude modulation of a carrier wave by the low frequency content of the audio signal. There is also a method based on generating frequency components such that the difference between adjacent partials approximates the frequency of the low frequency signal.

With advances in audio technology, audio systems are now not only able to reproduce music but also provide various audio-modes to listeners for listening to effects they desire. These audio-modes are helpful in creating musical effects the listeners want on the output of their audio systems. In some of these audio systems, there are options provided for specifically enhancing bass effect on the music. In this mode the system is expected to boost the bass frequency content of the system.

Some of the audio speakers of these audio systems are not able to reproduce low frequency spectrum efficiently. This is because of the limitation in size and other constraints of the audio speakers. As a result some of these audio systems, attenuate frequencies below 120 Hz. However, this disadvantageously prevents these audio systems from reproducing music effectively. In particular, some musical instruments examples of which are: drums and pianos have frequency components below 120 Hz.

Therefore, a need clearly exists for a method and system for enhancing bass effect of audio signals that overcome the problems or at least alleviate the limitations of existing systems.

SUMMARY OF THE INVENTION

The present invention seeks to provide a method and system for enhancing bass effect in audio signals using low complexity non-linear saturating functions.

Accordingly, in one aspect, the present invention provides a method for enhancing bass effect of audio signals, the audio signals having a first input channel and a second input channel, the method comprising the steps: extracting low frequency components of the first input channel and the second input channel producing low frequency components of the first input channel and the second input channel; passing the low frequency components of the first input channel through a sine wave transfer function to produce a first output signal; passing the low frequency components of the second input channel through a cosine wave transfer function to produce a second output signal; filtering the first output signal and the second output signal by a band pass filter to produce a band filtered first output signal and a band filtered second output signal; adding the band filtered first output signal to the first input channel producing a resultant first output signal; and adding the band filtered second output signal to the second input channel producing a resultant second output signal; wherein the resultant first output signal and the resultant second output signal are input to stereo speakers.

In a second aspect, the present invention provides, a system for enhancing bass effect of audio signals, the audio signals having a first input channel and a second input channel, the system comprising: a low pass filter for receiving the first and second input channels for extracting low frequency components of the first and second input channels; a sine function block for receiving low frequency components of the first input channel for producing a first output signal; a cosine function block for receiving low frequency components of the first input channel for producing a second output signal; a band pass filter for limiting the frequency range of the first output signal and the second output signal to a predetermined frequency range for respectively producing a band filtered first output signal and a band filtered second output signal; and a mixer for adding the band filtered first output signal to the first input channel; and a mixer for adding the band filtered second output signal to the second input channel.

In a third aspect, the present invention provides, a method for enhancing bass effect of audio signals, the audio signals having a first input channel and a second input channel, the method comprising the steps: extracting low frequency components of the first input channel and the second input channel producing low frequency components of the first input channel and the second input channel; mixing the low frequency components of the first input channel together with the low frequency components of the second input channel to produce an initial audio stream; splitting the initial audio stream into a first audio stream and a second audio stream; passing the first audio stream through a sine wave transfer function to produce a first output signal; passing the second audio stream through a cosine wave transfer function to produce a second output signal; filtering the first output signal and the second output signal by a band pass filter to produce a band filtered first output signal and a band filtered second output signal; adding the band filtered first output signal to the first input channel producing a resultant first output signal; and adding the band filtered second output signal to the second input channel producing a resultant second output signal; wherein the resultant first output signal and the resultant second output signal are input to stereo speakers.

In a fourth aspect, the present invention provides a system for enhancing bass effect of audio signals, the audio signals having a first input channel and a second input channel, the system comprising: a low pass filter for receiving the first and second input channels for extracting low frequency components of the first and second input channels; an initial block mixer for mixing the low frequency components of the first and second input channels producing an initial audio stream; a sine function block for receiving the initial audio stream for producing a first output signal; a cosine function block for receiving the initial audio stream for producing a second output signal; a band pass filter for limiting the frequency range of the first output signal and the second output signal to a predetermined frequency range for respectively producing a band filtered first output signal and a band filtered second output signal; and a mixer for adding the band filtered first output signal to the first input channel; and a mixer for adding the band filtered second output signal to the second input channel.

In a fifth aspect, the present invention provides a method for enhancing bass effect of audio signals, the audio signals having a first input channel and a second input channel, the method comprising the steps: extracting low frequency components of the first input channel and the second input channel producing low frequency components of the first input channel and the second input channel; mixing the low frequency components of the first input channel together with the low frequency components of the second input channel to produce a down mixed single audio stream; passing the down mixed single audio stream through a exponential transfer function to produce an output signal; filtering the output signal by a band pass filter to produce a band filtered output signal; adding the band filtered output signal to the first input channel producing a first resultant output signal; and adding the band filtered output signal to the second input channel producing a second resultant output signal; wherein the first and second resultant output signal are input to stereo speakers.

In a sixth aspect, the present invention provides a system for enhancing bass effect of audio signals, the audio signals having a first input channel and a second input channel, the system comprising: a low pass filter for receiving the first and second input channels for extracting low frequency components of the first and second input channels; a mixer for mixing the low frequency components of the first and second input channels producing a down-mixed single audio stream; an exponential block for receiving the initial audio stream for producing a output signal; a band pass filter for limiting the frequency range of the output signal to a predetermined frequency range for respectively producing a band filtered output signal; and a mixer for adding the band filtered output signal to the first input channel; and a mixer for adding the band filtered output signal to the second input channel.

In a seventh aspect, the present invention provides a method for enhancing bass effect of audio signals, the audio signals having a mono input channel, the method comprising the steps: extracting low pass frequencies of the mono input channel producing low frequency components of the mono input channel; passing the low frequency components of the mono input channel through a exponential transfer function to produce an output signal; filtering the output signal by a band pass filter to produce a band filtered output signal; and adding the band filtered output signal to the mono input channel producing a resultant output signal; wherein the resultant output signal is input to mono speakers.

In an eighth aspect, the present invention provides a system for enhancing bass effect of audio signals, the audio signals having a mono input channel, the system comprising: a low pass filter for receiving the mono input channel for extracting low frequency components of the mono input channel; an exponential block for receiving the low frequency components of the mono input channel for producing a output signal; a band pass filter for limiting the frequency range of the output signal to a predetermined frequency range for producing a band filtered output signal; and a mixer for adding the band filtered output signal to the mono input channel.

BRIEF DESCRIPTION OF THE DRAWINGS

Embodiments of the present invention will now be more fully described, by way of example, with reference to the drawings of which.

DETAILED DESCRIPTION

Figure 1:
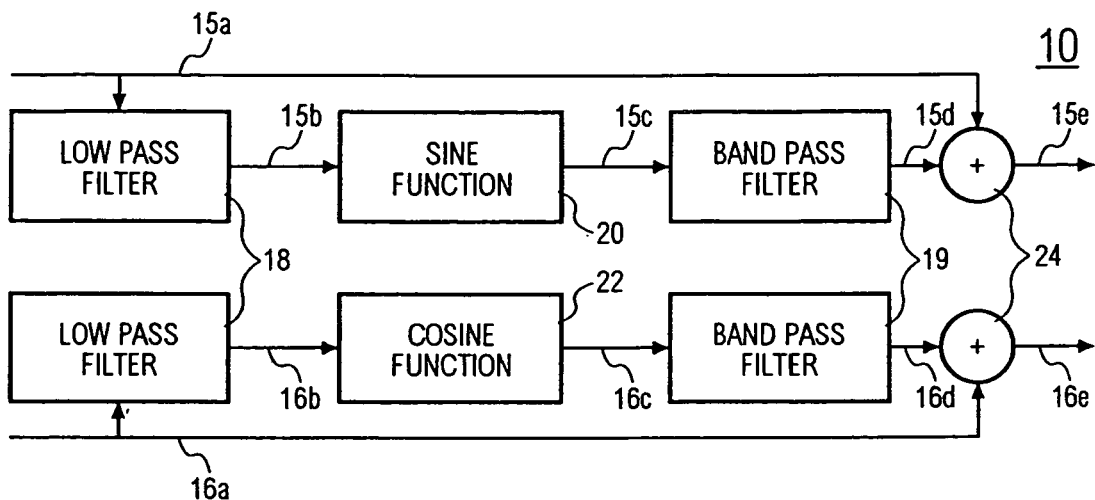
FIG. 1 illustrates a functional block diagram of a system according to a first embodiment.

In the following description, details are provided to describe the embodiments of the invention. It shall be apparent to one skilled in the art, however, that the embodiments may be practiced without such details. Some of these details may not be described at length so as not to obscure the preferred embodiments.

The embodiments can be used to improve the quality of music output from audio systems by simulating the effect of low frequency signals in the human ear. This thus allows listeners to perceive the lower frequencies signals, even though the speakers may be incapable of providing such low frequency outputs. The embodiments provide simple methods for enhancing bass effect of audio signals for enhanced perception. The simple methods also result in the processing of bass content being computationally less intensive.

Certain concepts pertaining to human hearing are further discussed to provide background regarding the embodiments. They are: temporal theory of human hearing, phenomenon of missing fundamental and the directional independence of low frequency components.

Temporal Theory of Human Hearing

The temporal theory of the human auditory system suggests that the pitch of a sound stimulus is related to the time pattern of the neural impulses evoked by that stimulus. Nerve firings tend to occur at a particular phase of a stimulating waveform. Thus, time intervals between successive spikes approximate integer multiples of the period of the stimulating waveform. Pitch is thus related to the time pattern of these nerve impulses. The temporal theory only applies to low frequencies and cannot work for frequencies above 4000 or 5000 Hz.

Thus when a complex sound waveform is exposed to the human ear; according to the temporal theory, the human ear will be able to perceive sounds of different pitches. These pitches might have been the result of interaction of several partials present in the complex sound signal. The pitch associated with the complex sound waveform would be the one to which attention is most strongly drawn by virtue of its loudness or of its contrast with previous sounds.

Non-Linear Saturation

When an input waveform is passed through a block which saturates the input in a gradual manner, an output waveform of this block will not only have the original frequency, but will also contain other frequency components. The frequency components present in the output waveform depends on the frequencies present in the input waveform and the configuration of the saturating curve. The non-linear curve does not treat the entire amplitude range in a similar way.

In other words, the gain of the curve depends on the amplitude range of the signal. Thus when an input waveform is normalized and passed through a block which does gradual saturation, it is equivalent to passing the input waveform through a non-linear curve. This results in an output waveform, which has other frequency components which are directly related to the frequencies present in the input waveform.

Directional Independence of Low Frequency Components

Low frequency components of music signals are found to have no directionality. This means that the direction from which the low frequency components of the music are coming from are not critical to the human ear. This is likely due to the fact that human ears are separated by a relatively short distance, resulting in the inability of the human brain to distinguish the direction from which the low frequency sound is coming from.

The bass effect enhancement described in a first and second embodiment are based on the response of sine and cosine transfer functions and on the directional independence of low frequency components. The human ear is unable to resolve directions from low frequency components. The bass effect enhancement described in a third embodiment is based on response of a exponential transfer function.

First Embodiment

Referring to FIG. 1, a system 10 for enhancing bass effect in audio signals in accordance with a first embodiment is shown. The system 10 is basically applicable for stereo channels. During processing, the contents of the stereo channels are performed separately. This assumes that the low frequency content in both the stereo channels are not totally independent of each other.

The system 10 comprises low pass filters 18 for extracting low pass frequency components from a first input channel 15a and a second input channel 16a. The two input channels being stereo channels. The system 10 further comprises a sine function block 20 and a cosine function block 22, both of which are coupled to band pass filters 19. The resulting output of the bandpass filters 19, are respectively added to the first input channel 15a and the second input channel 16a via mixers 24.

In operation, the method for enhancing bass effect in audio signals of the first embodiment starts with the step of extracting low frequency components 15b from the first input channel 15a using the low pass filter 18. Next, the low-frequency components 15b of the first input channel 15a are then passed through the sine function block 20. The sine function block 20 generates a first output signal 15c, having frequencies of which are dependent on the signal frequencies of the first input channel 15a.

Next, the first output signal further 15c undergoes filtering by a band pass filter 19. The band pass filter limits the frequency of harmonics from the first output signal 15c to a predetermined frequency range to produce a band filtered first output signal 15d. The band filtered first output signal 15d is then added to the original contents of the first input channel 15a via the mixer 24 producing a resultant first output signal 15e. The resultant first output signal 15e is then sent as input to one of the stereo input channels of an audio speaker.

The second input channel 16a is simultaneously and similarly processed. The method simultaneously extracts low pass frequency components 16b from the second input channel 16a using the low pass filter 18. The low-frequency components 16b of the second input channel 16a are then passed through the cosine function block 22. The cosine function block 22 generates a second output signal 16c, having frequencies of which are based on the signal frequencies of the second input channel 16a.

Next, the second output signal further 16c undergoes filtering by the band pass filter 19. The band pass filter limits the frequencies present in the first output signal 16c to a predetermined frequency range to produce a band filtered second output signal 16d. The band filtered second output signal 16d is then added to the original contents of the second input channel 16a via the mixer 24 producing a resultant second output signal 16e. The resultant second output signal 16e is then sent as input to one of the stereo input channels of the audio speaker.

In the method of the first embodiment, the resultant first output signal 15e will have the original contents of the first input channel 15a together with the filtered output of the sine function block 20. The resultant second output signal 16e will have the original contents of the second input channel 16a of the input audio signal together with the filtered output of the cosine function block 22. This results in an enhancement the bass effect of the audio signals.

Second Embodiment

Figure 2:
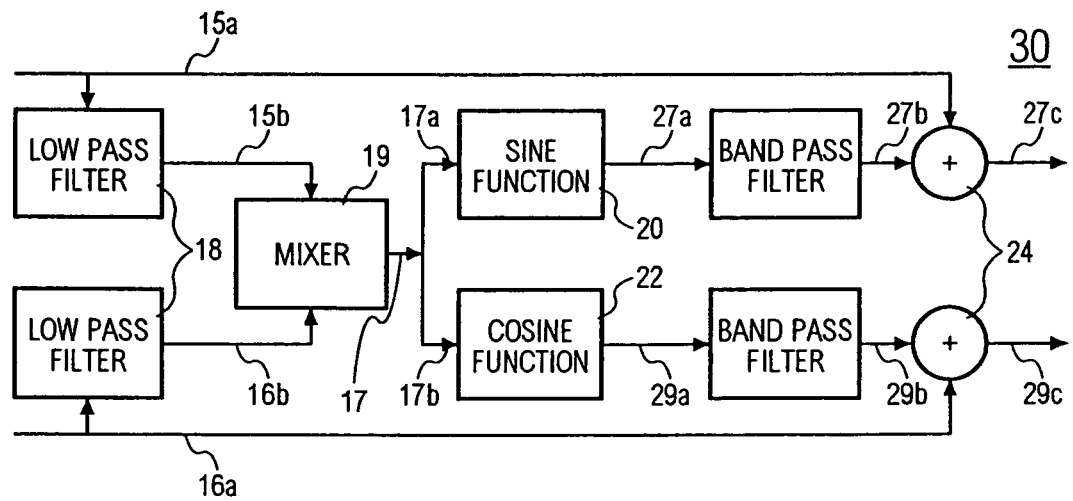
FIG. 2 illustrates a functional block diagram of a system according to a second embodiment.

Referring to FIG. 2, a system 30 for enhancing bass effect in audio signals in accordance with a second embodiment is shown. The system 30 is basically applicable for stereo channels and the output of the processing is a two channel audio output.

The system 30 similarly comprises low pass filters 18 for extracting low frequency components 15b, 16b from the first input channel 15a and the second input channel 16a. The two input channels being stereo channels. The system 30 further comprises an initial mixer block 19, a sine function block 20 and a cosine function block 22, both filters being coupled to the band pass filters 18. The resulting output of the bandpass filters 18 are respectively added to the first input channel 15a and the second input channel 16a via mixers 24.

In operation, the method for enhancing bass effect in audio signals of the second embodiment starts with the step of extracting low pass frequency components 15b, 16b from the first input channel 15a and the second input channel 16a using the low pass filters 18. Next, the low-frequency components 15b of the first input channel 15a and the low frequency components 16b of the second input channel 16a are added together in the initial mixer block 19, producing an initial audio stream 17.

The initial audio stream 17 is then split into a first audio stream 17a and a second audio stream 17b.

The first audio stream 17a is then passed through the sine function block 20. The sine function block 20 generates a first output signal 27a, the frequencies of which are dependent on the signal frequency of the first input channel 15a.

The second audio stream 17b is then passed through the cosine function block 22. The cosine function block 22 generates a second output signal 29a, having frequencies of which are dependent on the signal frequency of the first input channel 16a.

Next, the first output signal further 27a undergoes filtering by a band pass filter 19. The band pass filter limits the frequency of harmonics from the first output signal 27a to a predetermined frequency range to produce a band filtered first output signal 27b. The band filtered first output signal 27b is then added to the original contents of the first input channel 15a via the mixer 24 producing a resultant first output signal 27c. The resultant first output signal 27c is then sent as input to one of the stereo input channels of an audio speaker.

Simultaneously, the second output signal further 29a undergoes filtering by a band pass filter 19. The band pass filter 19 limits the frequency of harmonics from the second output signal 29a to a predetermined frequency range to produce a band filtered second output signal 29b. The band filtered first output signal 29b is then added to the original contents of the second input channel 16a via the mixer 24 producing a resultant second output signal 29c. The resultant second output signal 29c is then sent as input to one of the stereo input channels of the audio speaker.

In this method of the second embodiment, the resultant first output signal 27c will have the original contents of the first input channel 15a along with the filtered output of the sine function block 20. The resultant second output signal 29c will have the original contents of the second input channel 16a of the input audio signal along with the filtered output of the cosine function block 22.

In both the first and second embodiment, the audio speakers will output the resultant first output signal 15e, 27c and the resultant second output signal 16e, 29c. Since the human ear is unable to distinguish the direction from which the low frequencies signals come from. The combination of the resultant first output signal 15e, 27c and the resultant second output signal 16e, 29c will provide an enhancement to the bass effect of the audio signals.

Third Embodiment

The system and method of the third embodiment is utilizes the fact that a multiple tone wave passed through an exponential transfer function results in an output wave having multiple frequencies, which are multiples of input frequencies as well as sum and difference components of the input sinusoidal frequencies and its harmonics. The combined effect of all these frequencies will give the same acoustical effect as the original input wave to the system.

The bass effect enhancement method of the third embodiment may be applied on both mono as well as stereo input signals. The third embodiment involves low pass filtering, passing through an exponential transfer function to generate harmonic frequencies and sum and difference frequencies. A band pass filter is also used to limit the range of the frequency components.

Figure 3:
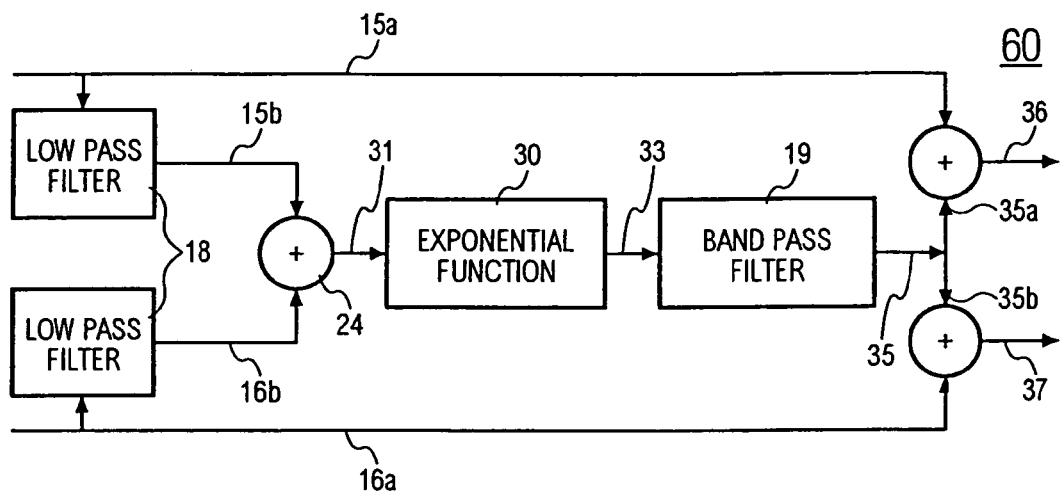
FIG. 3 illustrates a functional block diagram of a system according to a third embodiment.

Referring to FIG. 3, the system 60 of the third embodiment comprises low pass filters 18 for extracting low pass frequencies from a first input channel 15a and a second input channel 16a. The two input channels being stereo channels. The system 60 further comprises mixers 24 and an exponential function block 30, which is coupled to a band pass filter 19. The resulting output of the bandpass filter 19 is split and added to the first input channel 15a and the second input channel 16a via the mixers 24.

In operation, the method for enhancing bass effect in audio signals of the third embodiment starts with the step of extracting low frequency components 15b, 16b from the first input channel 15a and the second input channel 16a using the low pass filters 18. Next, the low-frequency components 15b of the first input channel 15a and the low frequency components 16b of the second input channel 16a are added together in a mixer 24, producing a down-mixed single audio stream 31.

Afterwhich, the step of passing the down-mixed single audio stream 31 through the exponential function block 30 is performed to generate an output signal 33.

Next, the output signal 33 undergoes filtering by a band pass filter 19. The band pass filter limits the frequency from the output signal 33 to a predetermined frequency range to produce a band filtered output signal 35. The band filtered output signal 35 is then split into a first band filtered output signal 35a and a second band filtered output signal 35b.

The first band filtered output signal 35a is added to the original contents of the first input channel 15a via a mixer 24 producing a first resultant output signal 36. The second band filtered output signal 35b is added to the original contents of the second input channel 16a via a mixer 24 producing a second resultant output signal 37.

The first resultant output signal 36 and the second resultant output signal 37 are then sent as input to the stereo input channels of audio speakers.

Figure 4:
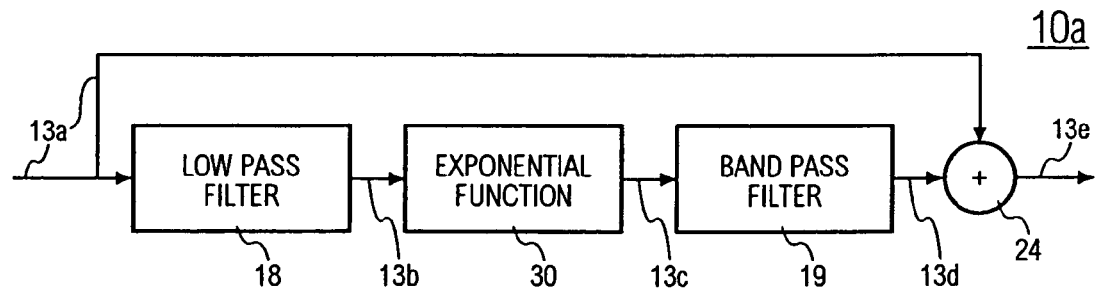
FIG. 4 illustrates a functional block diagram of a system according to a mono version of the third embodiment.

Referring to FIG. 4, the system 60 and method of the third embodiment may be easily adapted for catering to mono input of audio signals. The system 60a for mono input of audio signals in accordance with the third embodiment comprises a single mono input channel 13a, the exponential function block 30 coupled to the low pass filter 18 and the band pass filter 19.

In operation, the method for enhancing bass effect in audio signals for mono input in accordance with the third embodiment starts with the step of extracting low frequency components 13b from the mono input channel 13a using the low pass filter 18.

Afterwhich, the step of passing the low frequency components 13b from the mono input channel 13a through the exponential function block 30 is performed to generate an output signal 13c.

Next, the output signal 13c undergoes filtering by the band pass filter 19. The band pass filter 19 limits the frequency from the output signal 13c to a predetermined frequency range to produce a band filtered output signal 13d.

The band filtered output signal 13d is then added to the original contents of the mono input channel 13a via mixer 24 producing a resultant output signal 13e.

The resultant output signal 13e is then sent as input to a mono input channel of audio speakers.

Sine Function Block

The Sine function block 20 transforms the input by passing it through a sine wave transfer function. The input to this block are the outputs of the low pass filter 18 and hence consists of only low frequency components of the audio signal. When the low frequency components of the audio signal are passed through this sine function block 20, the output of the sine wave transfer function will have frequency components which are directly related to the input frequency components.

$$y(i)=\sin(x(i)) \qquad \text{Eqn.1}$$

Where,
x is the input signal which is normalized
y is the output normalized signal.

Eqn.1 given above shows the sine wave transfer function present in this block. The output vector y is basically derived after passing the input vector x through a non linear sine wave transfer function.

Cosine Function Block

The Cosine function block 22 transforms input by passing it through a cosine wave transfer function. The input to this block is the output of the low pass filter 18 and will consist of only low frequency components of the audio signal. When the low frequency components are passed through this cosine wave function block 22, the output of the cosine transfer function will-have frequency components which are directly related to the input frequency components.

$$y(i)=\cos(x(i)) \qquad \text{Eqn.2}$$

Eqn.2 given above shows the transfer function present in this block. The output vector y is basically derived after passing the input vector x through a non linear cosine wave transfer function.

Exponential Function Block

The Exponential function block 30 transforms input by passing it through a exponentially curved transfer function. The input to this block 30 is the output of the low pass filter 18 and hence it consists of only low frequency components of the audio signal. When the low frequency components of the audio signal are passed through this exponential function block 30, the output of this block will have new frequency components which are directly related to the input frequency components.

$$y(i)=\exp(x(i)) \qquad \text{Eqn.3}$$

Eqn.3 given above shows the transfer function present in this block. The output vector y is basically derived after passing the input vector x through a non linear exponentially saturating transfer function.

Initial Mixer Block

The initial mixer block 19 is responsible for mixing of the contents of the first input channel 15a and the second input channel 16a in the second embodiment. The initial mixer block 19 allows a user to control the percentage of the content of each input channel 15a, 16a in the resultant output signals 15e, 16e. The initial mixer block 19 mixes the contents of the two input channels 15a, 16a weighted by weights w1 and w2 as specified by the user. Eqn.4 given below specifies how the mixer channel output is obtained.

$$q(i)=w1*l(i)+w2*r(i) \qquad \text{Eqn.4}$$

Where
l(i) is the content in audio channel 1
r(i) is the content in audio channel 2
w1 and w2 are the user specified scaling factors subjected to the constraint
and where $$w1+w2=1 \qquad \text{Eqn.5}$$

Simulations and Results

Figure 5:
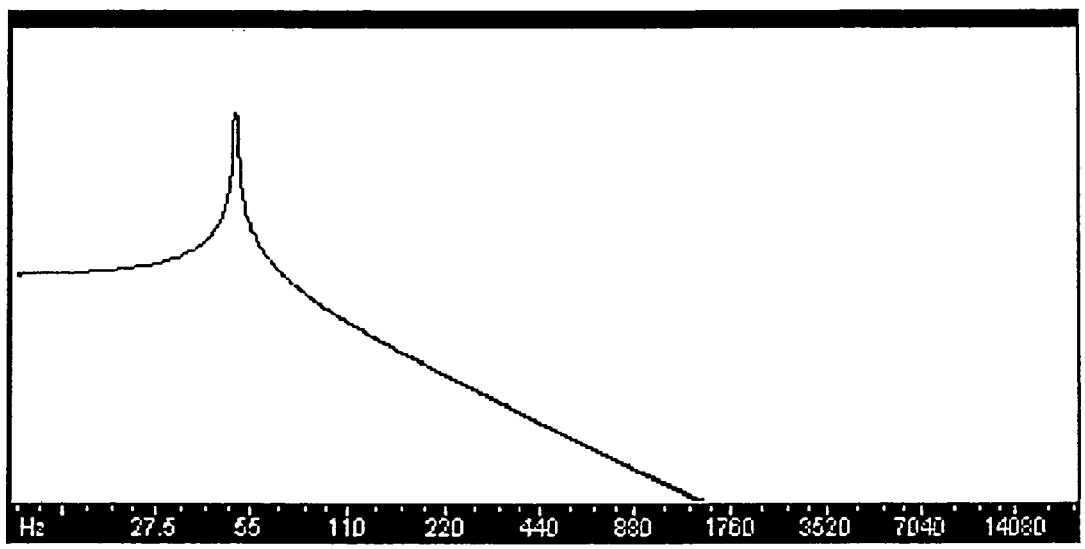
FIG. 5 illustrates a frequency plot of an input signal having a 50 Hz frequency component.
Figure 6:
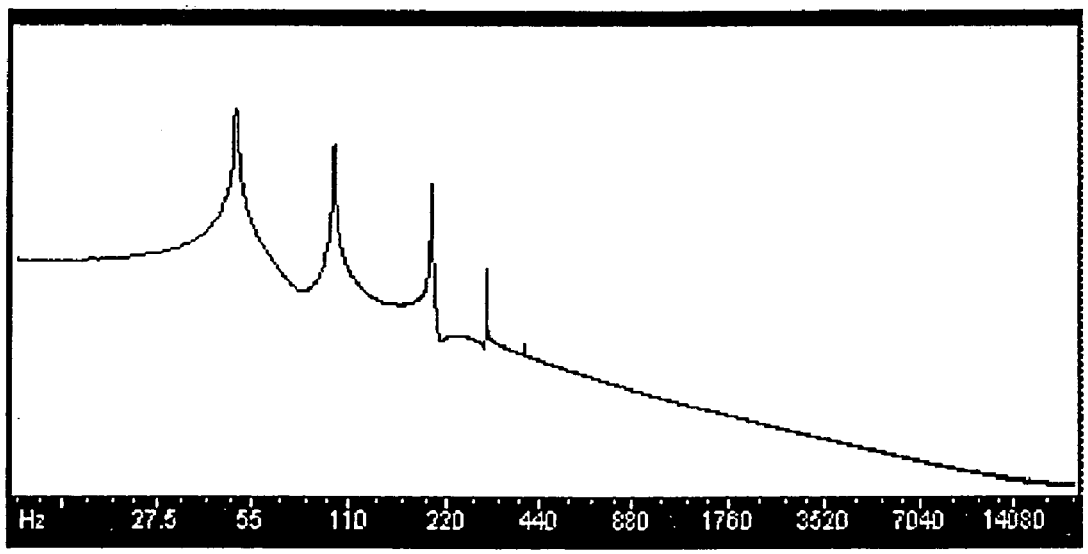
FIG. 6 illustrates a frequency domain plot of a resultant first output signal of the first and second embodiment having an input as shown in FIG. 5.
Figure 7:
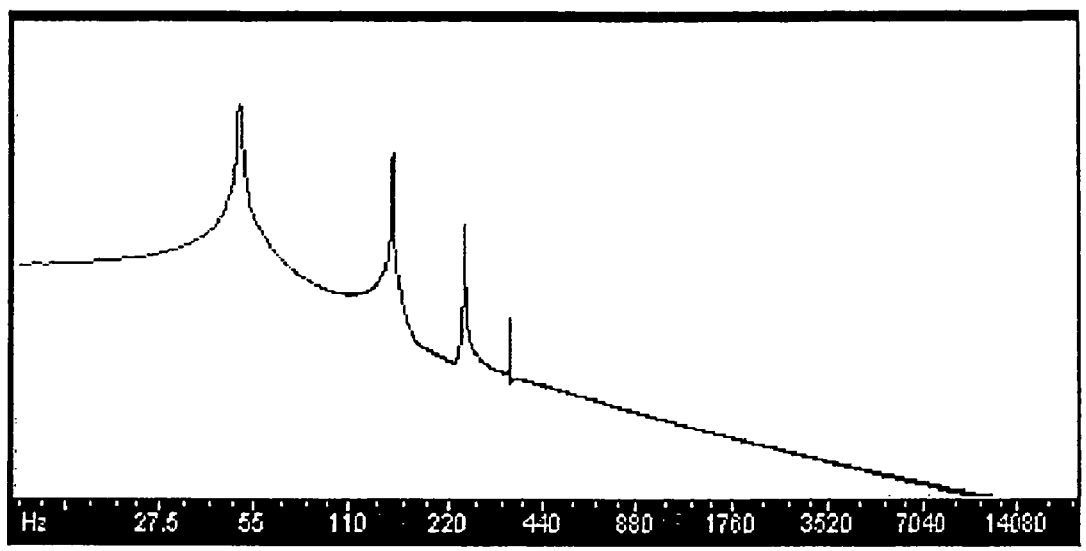
FIG. 7 illustrates a frequency domain plot of a resultant second output signal of the first and second embodiment having an input as shown in FIG. 5.

A first simulation was performed using a simple 50 Hz sine wave as input to both input channels 15a, 16a of the system 10, 30 of the first and second embodiment. Referring to FIG. 5, a frequency domain plot of the input waveform is shown. Referring to FIG. 6 and FIG. 7 the frequency domain plots of the resultant output waveforms of the system 10, 30 for the resultant first output signal 15e, 27c and the resultant second output signal 16e, 29c are shown respectively.

Referring to FIG. 5, the input waveform has only one component at 50 Hz. Referring to FIG. 6, the resultant first output signal 15e, 27c comprises the original signal component at 50 Hz and the $2^{nd}$, $4^{th}$ and $6^{th}$ harmonics (even) of the input waveform.

Referring to FIG. 7, the resultant second output signal 16e, 29c comprises of the original signal component at 50 Hz and the $3^{rd}$, $5^{th}$ and $7^{th}$ harmonics (odd) of the input waveform.

Figure 8:
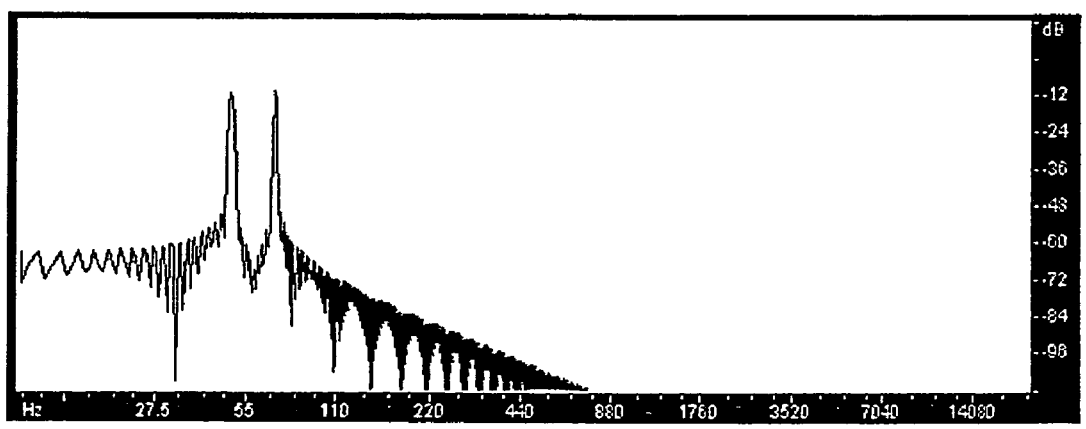
FIG. 8 illustrates a frequency domain plot of an input signal having a 50 Hz and 70 Hz frequency component.
Figure 9:
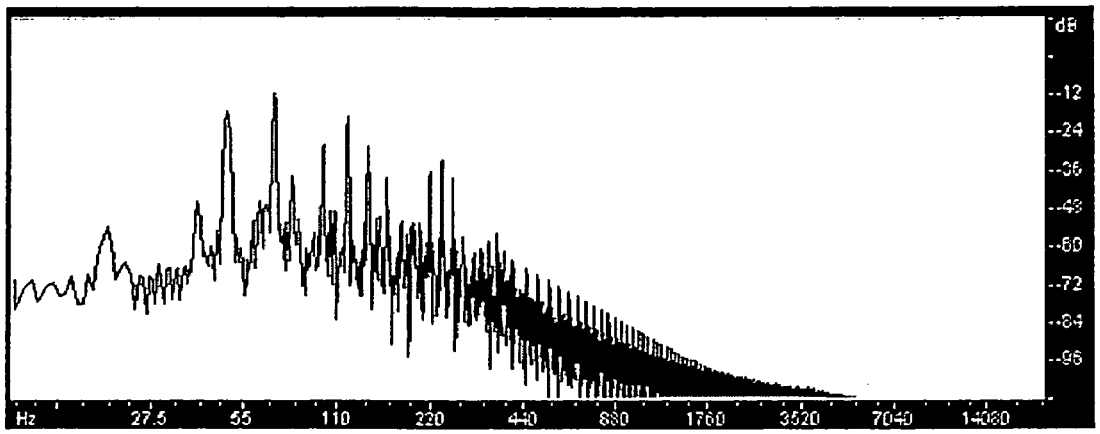
FIG. 9 illustrates a frequency domain plot of a resultant first output signal of the first and second embodiment having an input as shown in FIG. 8.

A second simulation was performed using an input waveform containing frequency components at 50 and 70 Hz as shown in FIG. 8. Referring to FIG. 9, the resultant first output signal 15e, 27c comprises the original signal component at 50 Hz and 70 Hz together with frequency components at 100, 120, 140, 160, 220, 140 and 160 Hz.

Figure 10:
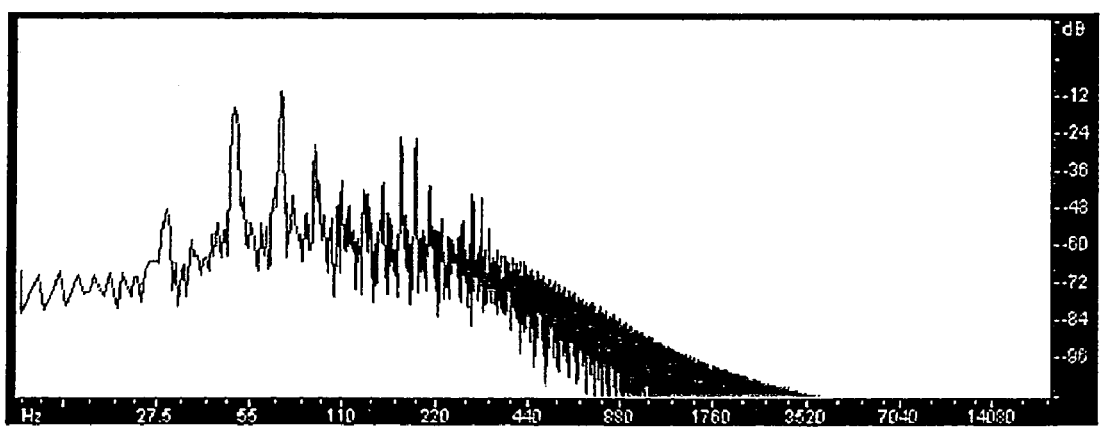
FIG. 10 illustrates a frequency domain plot of a resultant second output signal of the first and second embodiment having an input as shown in FIG.8.

Referring to FIG. 10, the resultant second output signal 15e, 27c comprises the original signal component at 50 Hz and 70 Hz together with frequency components at 150, 170, 190, 210, 290 and 310 Hz.

A third simulation was performed using an input audio signal having frequency components at 50 Hz and 75 Hz for input into the system 60, 60a in accordance with the third embodiment.

Figure 11:
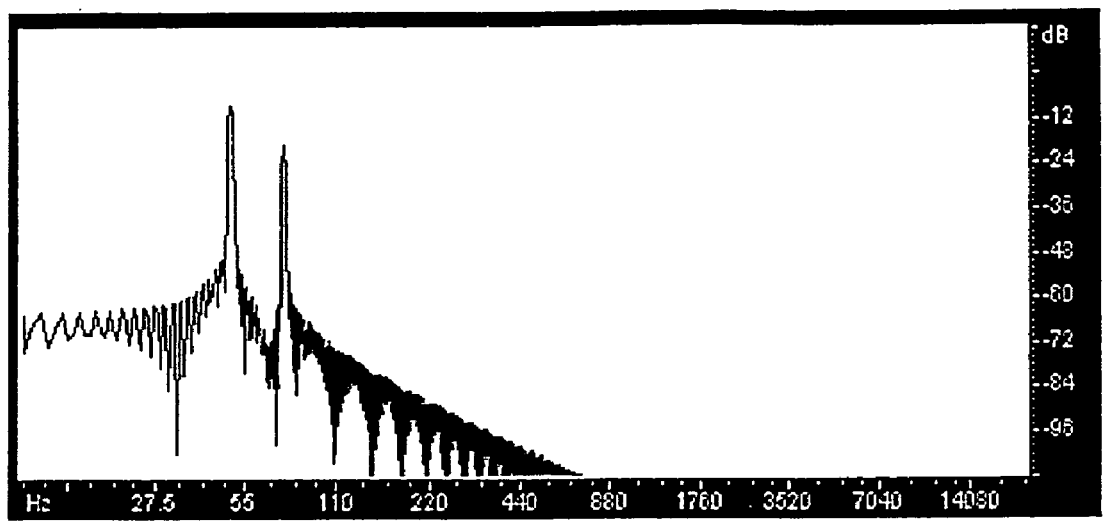
FIG. 11 illustrates a frequency domain plot of an input signal having 50 Hz and 75 Hz frequency components.

Referring to FIG. 11, a frequency domain plot of the input audio signal is shown. Referring to FIG. 6 and FIG. 7 the frequency domain plots of the resultant output waveforms of the system 10, 30 for the resultant first output signal 15e, 27c and the resultant second output signal 16e, 29c are shown respectively.

Figure 12:
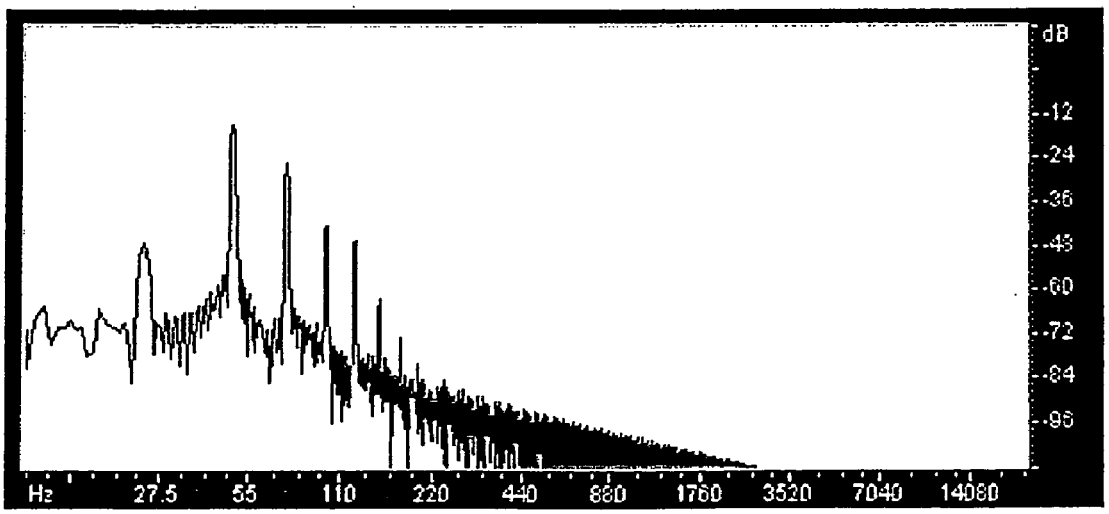
FIG. 12 illustrates a frequency domain plot of a resultant output signal of the third embodiment having an input as shown in FIG. 1.

When this input audio signal is input to the exponential function block 30, the output of the block is as shown in FIG. 12. It can be seen that the output has frequency components at 100 Hz (Harmonic of 50 Hz), 125 Hz (75+50 Hz), 150 Hz (Harmonic of 75 Hz), 25 Hz (75−50 Hz) and the original frequency components at 50 Hz and 75 Hz.

It can be seen that in response to the input signal which consisted of 2 sinusoidal frequencies, the output comprises sinusoidal frequencies at 25 Hz, 50 Hz, 75 Hz, 100 Hz, 125 Hz, 150 Hz and 175 Hz.

It will be appreciated that although the embodiments have been described in detail, various modifications and improvements can be made by a person skilled in the art without departing from the scope of the present invention.

Some additional modifications for further improving on the described embodiments are for example: adding high pass filters to the systems 10, 30, 60, 60a to extract high frequency components of the input channels 15a, 16a, 13a before adding them to the band filtered output signals 15d, 16d, 27b, 29b, 35a, 35b, 13d to thereby produce the resultant output signals 15e, 16e, 27c, 29c, 36, 37, 24.

Another example is: adding an attenuator to attenuate the low frequency components 15b, 16b, 13b of the input channels 15a, 16a, 13a before further processing.

The invention claimed is:

1. A method for processing audio signals, the audio signals having a first input channel and a second input channel, the method comprising the steps:

a extracting low frequency components of the first input channel and the second input channel producing low frequency components of the first input channel and the second input channel;

b. mixing the low frequency components of the first input channel together with the low frequency components of the second input channel to produce an initial audio stream;

c. splitting the initial audio stream into a first audio stream and a second audio stream;
d. passing the first audio stream through a sine wave transfer function to produce a first output signal;
e. passing the second audio stream through a cosine wave transfer function to produce a second output signal;
f. filtering the first output signal and the second output signal by a band pass filter to produce a band filtered first output signal and a band filtered second output signal;
g. adding the band filtered first output signal to the first input channel producing a resultant first output signal; and
h. adding the band filtered second output signal to the second input channel producing a resultant second output signal.

2. The method of claim 1, wherein step f. the first output signal and the second output signal are limited to a predetermined frequency range.

3. The method of claim 1, wherein the sine wave transfer function is represented by: $y(i)=\sin(x(i))$ where, x is the input signal which is normalized; and y is the output normalized signal.

4. The method of claim 1, wherein the cosine wave transfer function is represented by: $y(i)=\cos(x(i))$ where, x is the input signal which is normalized; and y is the output normalized signal.

5. The method of claim 1, wherein step g. further comprises extracting high frequency components of the first input channel and adding the high frequency components to the band filtered first output signal.

6. The method of claim 1, wherein step h. further comprises extracting high frequency components of the second input channel and adding the high frequency components to the band filtered second output signal.

7. The method of claim 1, wherein step a. further comprises attenuating the low frequency components of the first input channel and the second input channel.

8. A system for processing audio signals, the audio signals having a first input channel and a second input channel, the system comprising:
a low pass filter adapted to receive the first and second input channels and extract low frequency components of the first and second input channels;
an initial block mixer adapted to mix the low frequency components of the first and second input channels and produce an initial audio stream;
a sine function block adapted to receive the initial audio stream and produce a first output signal;
a cosine function block adapted to receive the initial audio stream and produce a second output signal;
a band pass filter adapted to limit the frequency range of the first output signal and the second output signal to a predetermined frequency range and respectively produce a band filtered first output signal and a band filtered second output signal;
a mixer adapted to add the band filtered first output signal to the first input channel; and
a mixer adapted to add the band filtered second output signal to the second input channel.

9. The system of claim 8, further comprising a high pass filter adapted to extract high frequency components of the first input channel and the second input channel before addition to the band filtered first output signal and the band filtered second output signal, respectively.

10. The system of claim 8, further comprising an attenuator adapted to attenuate the low frequency components of the first input channel and the second input channel.

11. A method for processing audio signals, the audio signals having a first input channel and a second input channel, the method comprising the steps:
a. extracting low frequency components of the first input channel and the second input channel producing low frequency components of the first input channel and the second input channel;
b. passing a signal derived from the low frequency components of the first and second input channels through a first sinusoidal wave transfer function and a second sinusoidal wave transfer function to produce a first output signal and a second output signal;
c. filtering the first output signal and the second output signal by a band pass filter to produce a band filtered first output signal and a band filtered second output signal;
d. adding the band filtered first output signal to the first input channel producing a resultant first output signal; and
e. adding the band filtered second output signal to the second input channel producing a resultant second output signal.

12. The method of claim 11 wherein passing a signal derived from the low frequency components of the first and second input channels through a sinusoidal wave transfer function comprises: mixing the low frequency components of the first and second input channels together to generate the signal derived from the low frequency components and passing the mixed low frequency components through both a sine wave transfer function and a cosine wave transfer function.

13. The method of claim 1, wherein step d. the first output signal and the second output signal are limited to a predetermined frequency range.

14. The method of claim 11, wherein the sinusoidal wave transfer function is represented by: $y(i)=\sin(x(i))$ where, x is the input signal which is normalized; and y is the output normalized signal.

15. The method of claim 11, wherein the sinusoidal wave transfer function is represented by: $y(i)=\cos(x(i))$ where, x is the input signal which is normalized; and y is the output normalized signal.

16. The method of claim 11, wherein step d. further comprises extracting high frequency components of the first input channel and adding the high frequency components to the band filtered first output signal.

17. The method of claim 11, wherein step e. further comprises extracting high frequency components of the second input channel and the adding the high frequency components to the band filtered second output signal.

18. The method of claim 11, wherein step a. further comprises attenuating the low frequency components of the first input channel and the second input channel.

19. A system for processing audio signals, the audio signals having a first input channel and a second input channel, the system comprising:
a low pass filter adapted to receive the first and second input channels and extract low frequency components of the first and second input channels;
a circuit adapted to pass a signal derived from the low frequency components of the first and second input channels through a first sinusoidal wave transfer function and a second sinusoidal wave transfer function produce a first output signal and a second output signal;
a band pass filter adapted to limit the frequency range of the first output signal and the second output signal to a predetermined frequency range and respectively produce a band filtered first output signal and a band filtered second output signal;

a mixer adapted to add the band filtered first output signal to the first input channel; and a mixer adapted to add the band filtered second output signal to the second input channel.

20. The system of claim 19 further comprising
a mixer adapted to mix the low frequency components of the first and second input channels together;
a sine function block adapted to receive the mixed low frequency components and produce the first output signal; and
a cosine function block adapted to receive the mixed low frequency components and produce the second output signal.

21. The system of claim 19, further comprising a high pass filter adapted to extract high frequency components of the first input channel and the second input channel before addition to the band filtered first output signal and the band filtered second output signal.

22. The system of claim 19, further comprising an attenuator adapted to attenuate the low frequency components of the first input channel and the second input channel.

23. A method for processing audio signals, the audio signals having a first input channel and a second input channel, the method comprising the steps:
 a. extracting low frequency components of the first input channel and the second input channel producing low frequency components of the first input channel and the second input channel;
 b. mixing the low frequency components of the first input channel together with the low frequency components of the second input channel to produce an initial audio stream;
 c. passing the initial audio stream through a sinusoidal transfer function to produce an output signal;
 d. filtering the output signal by a band pass filter to produce a band filtered output signal; and
 e. adding the band filtered output signal to the first input channel producing a resultant output signal.

24. The method of claim 23, wherein the sinusoidal transfer function is selected from the group consisting of a sine wave transfer function and a cosine wave transfer function.

25. The method of claim 23, further comprising:
 f. splitting the initial audio stream into a first audio stream and a second audio stream; and
 wherein c. passing comprises:
  c1. passing the first audio stream through a first transfer function to produce a first output signal; and
  c2. passing the second audio stream through a second transfer function to produce a second output signal.

26. The method of claim 25, wherein the first transfer function is a sine wave transfer function and the second transfer function is a cosine wave transfer function.

27. The method of claim 26, wherein the sine wave transfer function is represented by: $y(i)=\sin(x(i))$ where, x is the input signal which is normalized; and y is the output normalized signal.

28. The method of claim 26, wherein the cosine wave transfer function is represented by: $y(i)=\cos(x(i))$ where, x is the input signal which is normalized; and y is the output normalized signal.

29. The method of claim 25, wherein d. filtering comprises:
 d1. filtering the first output signal by a first band pass filter to produce a band filtered first output signal; and
 d2. filtering the second output signal by a second band pass filter to produce a band filtered second output signal.

30. The method of claim 29, wherein e. adding comprises:
 e1. adding the band filtered first output signal to the first input channel producing a resultant first output signal; and
 e2. adding the band filtered second output signal to the second input channel producing a resultant second output signal.

31. The method of claim 23, wherein e. adding further comprises extracting high frequency components of the first input channel and adding the high frequency components to the band filtered output signal.

32. The method of claim 23, wherein a. extracting further comprises attenuating the low frequency components of the first input channel and the second input channel.

33. A system for processing audio signals, the audio signals having a first input channel and a second input channel, the system comprising:
 a low pass filter adapted to receive the first and second input channels and extract low frequency components of the first and second input channels;
 an initial block mixer adapted to mix the low frequency components of the first and second input channels and produce producing an initial audio stream;
 a sinusoidal transfer function block adapted to receive the initial audio stream and produce for producing an output signal;
 a band pass filter adapted to limit the frequency range of the output signal to a predetermined frequency range and produce a band filtered output signal; and
 an adder adapted to add the band filtered output signal to the first input channel.

34. The system of claim 33, wherein the sinusoidal transfer function block is selected from the group consisting of a sine wave transfer function block and a cosine wave transfer function block.

35. The system of claim 32 further comprising a circuit adapted to split the initial audio stream into a first audio stream and a second audio stream; and
 wherein the transfer function block comprises:
  a first transfer function through which the first audio stream passes adapted to produce a first output signal; and
  a second transfer function block through which the second audio stream passes adapted to produce a second output signal.

36. The system of claim 35 wherein the first transfer function block implements a sine wave transfer function and the second transfer function block implements a cosine wave transfer function.

37. The system of claim 36, wherein the sine wave transfer function is represented by: $y(i)=\sin(x(i))$ where, x is the input signal which is normalized; and y is the output normalized signal.

38. The system of claim 36, wherein the cosine wave transfer function is represented by: $y(i)=\cos(x(i))$ where, x is the input signal which is normalized; and y is the output normalized signal.

39. The system of claim 35, wherein the band pass filter comprises a band pass filter adapted to limit the frequency range of the first output signal and the second output signal to a predetermined frequency range and respectively produce a band filtered first output signal and a band filtered second output signal.

40. The system of claim 39, wherein the adder comprises a first adder adapted to add the band filtered first output signal to the first input channel, and further comprises a second adder adapted to add the band filtered second output signal to the second input channel.

41. The system of claim 33, further comprising a high pass filter adapted to extract high frequency components of the first input channel before addition to the band filtered output signal.

42. The system of claim 33, further comprising an attenuator adapted to attenuate the low frequency components of the first input channel and the second input channel.

\* \* \* \* \*

UNITED STATES PATENT AND TRADEMARK OFFICE
CERTIFICATE OF CORRECTION

PATENT NO. : 7,961,888 B2
APPLICATION NO. : 11/280952
DATED : June 14, 2011
INVENTOR(S) : Sudhir Kumar Kasargod et al.

Page 1 of 1

It is certified that error appears in the above-identified patent and that said Letters Patent is hereby corrected as shown below:

In the Claims:

At column 14, claim number 33, line number 24, please delete the word "producing".

At column 14, claim number 33, line number 26, please delete the words "for producing".

Signed and Sealed this
Twenty-third Day of August, 2011

David J. Kappos
*Director of the United States Patent and Trademark Office*